(12) United States Patent
Fujieda et al.

(10) Patent No.: US 6,557,002 B1
(45) Date of Patent: Apr. 29, 2003

(54) DATA MANAGEMENT SYSTEM FOR STORING STRUCTURAL ELEMENT DATA MANAGEMENT PROGRAM

(75) Inventors: Makoto Fujieda, Fujisawa (JP); Katsuhide Maeda, Tokyo (JP); Takuro Nakagawa, Tokyo (JP); Takahito Yoshimatsu, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/435,782

(22) Filed: Nov. 8, 1999

(30) Foreign Application Priority Data

Nov. 9, 1998 (JP) .......................... 10-317481

(51) Int. Cl.⁷ .............................................. G06F 7/00
(52) U.S. Cl. ...................................... 707/102; 707/100
(58) Field of Search .............................. 707/1–4, 8, 10, 707/100–103 Z

(56) References Cited

U.S. PATENT DOCUMENTS

| | | | | | |
|---|---|---|---|---|---|
| 4,821,197 A | * | 4/1989 | Kenik et al. | ................... | 29/701 |
| 5,297,241 A | * | 3/1994 | Hirr et al. | ................... | 345/419 |
| 5,347,612 A | * | 9/1994 | Fujimoto et al. | ........... | 704/243 |
| 5,526,271 A | * | 6/1996 | Abumehdi | ................... | 705/403 |
| 5,806,069 A | * | 9/1998 | Wakiyama et al. | ........... | 700/97 |
| 5,963,724 A | * | 10/1999 | Mantooth et al. | ............. | 703/14 |
| 6,128,002 A | * | 10/2000 | Leiper | ......................... | 345/156 |
| 6,148,302 A | * | 11/2000 | Beylin et al. | ............... | 707/100 |
| 6,324,587 B1 | * | 11/2001 | Trenbeath et al. | ........... | 709/206 |

* cited by examiner

Primary Examiner—Greta Robinson
Assistant Examiner—Harold E. Dodds, Jr.
(74) Attorney, Agent, or Firm—Staas & Halsey LLP

(57) ABSTRACT

A structural element data management system which assures easy and accurate update of parts structure of a product and management of required parts in the producing and design department. The structural element data management system includes a structural element display for displaying a relationship between the desired product or parts and a structural element forming the product or parts, and a system parts relationship display for displaying a relationship between a plurality of products or parts of the same system and a plurality of structural elements.

12 Claims, 10 Drawing Sheets

FIG. 4

| LX-277 | LX-277A | LX-277B | LX-277C | LX-277D |
|---|---|---|---|---|
| K270074*1 | 1 | 1 | 1 | — |
| L370768*1 | 1 | 1 | 1 | 1 |
| M540752*1 | 1 | — | — | 1 |
| N840158*1 | 1 | — | 1 | — |

MATRIX PARTS LIST

FIG. 5

| LX-277 | | LX-277A | LX-277B | LX-277C | LX-277D |
|---|---|---|---|---|---|
| K270074*1 | DRAWING | V2R1 | V2R1 | V2R1 | |
| | PARTS LIST | V2R2 | V2R2 | V2R2 | |
| L370768*1 | DRAWING | V2R2 | V2R2 | V2R2 | V2R2 |
| | PARTS LIST | V2R2 | V2R2 | V2R2 | V2R2 |
| M540752*1 | DRAWING | V2R2 | | | V2R2 |
| | PARTS LIST | V2R2 | | | V2R2 |
| N840158*1 | DRAWING | V2R1 | | V2R1 | |
| | PARTS LIST | V2R1 | | V2R1 | |

VERSION NUMBER MANAGEMENT MATRIX

DATA MANAGEMENT SYSTEM FOR STORING STRUCTURAL ELEMENT DATA MANAGEMENT PROGRAM

CROSS REFERENCE TO RELATED APPLICATIONS

This application is based upon and claims priority of Japanese Patent Application No. 10-317481, filed Nov. 9, 1998, the contents being incorporated herein by reference.

BACKGROUND OF THE INVENTION

1. Field of the Invention

The present invention relates to a management system and method for assembling parts information. More particularly, the present invention relates to a structural element data management system and method, and a computer readable data storage medium to store a structural element data management program.

2. Description of the Related Art

The process of designing and producing industrial products may be divided into several types of processes including a conceptual design process for discussing the functional specifications of a product and for evaluating total design and functional performance of each unit through numerical analysis; a detail design process for designing details of each unit; a trial manufacturing process for confirming the total design content; a producing and designing process for designing assembling procedures and production line for each unit and scheduling arrangement of necessary parts; and a producing process for actual mass-production of a product.

In the detail design process, a computer-aided design system (CAD) which can process drawings as electronic data is in widespread use for assuring highly efficient design and engineering of an existing product. A Product Data Management system (PDM) has been introduced as a tool for administration of a large amount of data generated as described above. In operation of the PDM, information related to individual drawings, such as location of drawing information, date of design and name of designer, can be administered. Moreover, related information (i.e., product structural information) of assembled units and parts, and work flow of a design job, such as approval of design contents and request for output of drawing, can also be administered.

In the case of designing electronic devices, such as a personal computer or audio visual device, the detail design process may be classified into a design job to design the outline of the product and internal mechanical units and a design job to design electronic circuits and printed circuit substrates. These two types of design jobs are different from each other to a large extent in the knowledge required for design, design profile and job know-how. Therefore, the tool for assuring a highly efficient design job, such as CAD, is also largely different in the functional specification and there is no compatibility in its electronic data. Because of the differences in the two types of design jobs, respective design jobs are generally conducted in different departments, and the PDM has also been structured as the system for realizing highly efficient jobs in different departments.

On the other hand, in performing the trial manufacturing process and production/design process, which are considered to be the post-process of the detail design process, order issuing and receiving of necessary parts are conducted and the assembling process of a product is designed based on the drawings delivered as an accomplishment from the respective design sections. Further, the introduction of the Enterprise Resource Planning system (ERP) is scheduled as a system to realize high efficiency of these jobs. ERP is useful to determine how many products should be produced during which period, and also to plan the number of required units and parts to be ordered and an ordering period thereof on the basis of the product delivery schedule.

A series of jobs may be linked to further improve efficiency by providing an interface between the respective systems structured for each process and a department. However, development of a system having integrated respective systems is now underway.

To advance the integration of systems, the PDM or ERP development makers and consulting firms which are engaged in the consulting job for setting up the systems continue to discuss methods of realizing integration by fully introducing the maximum efficiency of jobs of each process and department.

In the producing and designing department for making parts, ordering parts and instructing production, the number of required parts is calculated based on the structural drawings indicating the parts structuring of each product or assembling parts and structural element information, such as a parts list providing detailed information of parts required for assembling.

At present, many series of products are required in producing only one product. For example, with a product such as a personal computer, the cabinet comes in a variety of different colors, and certain types of products are to be shipped to foreign countries. However, problems occur when it is required to change to a part having the same shape, but a different color, or to change to a part having the same function but a different operating voltage. More specifically, even if the detail of the corresponding structural elements is changed in the producing and designing department by performing parts ordering and issuing the production of the structural element designated only by the original parts list in accordance with the change, the producing and designing department cannot directly obtain, in the form of electronic data, the structural element information of the similar parts which may be used in the same manner. Therefore, it has been difficult to provide a flexible response, and it has also been requested to issue again the instruction in the form of a new structural drawings and new parts lists by intentionally starting again the jobs from the concept design department and detail design department.

Moreover, presently, almost all products in the assembling system are structured by including circuit parts, such as electronic circuits and substrates, and mechanical parts, such as the external shape of the product and the internal mechanical unit. However, because the circuit parts and mechanical parts are designed in different manners in different departments, in order to produce a particular product, the producing and design department has been requested to perform complicated and troublesome jobs, such as accurately calculating the number of required parts by summarizing the parts information obtained individually from respective design departments.

SUMMARY OF THE INVENTION

It is an object of the present invention to overcome the above problems of the known systems of designing and producing products, and to provide a structural element data management system and method which can easily and accurately execute a change of parts structure of a product and management of the required parts.

It is another object of the present invention to provide a computer readable data storage medium to store a program to realize such data management.

Objects and advantages of the present invention are achieved in accordance with embodiments of the present invention with a structural element data management system for management of data regarding a product or a part and a structural element forming the product or part, comprising structural element displaying means for displaying a relationship between a product or part and a structural element forming the product or part; and system element relationship displaying means for displaying a relationship between a plurality of products or parts of a same system and a plurality of structural elements.

The system element relationship displaying means displays a relationship diagram of a system which is the same as a product or part designated by an operator for the display by the structural element displaying means.

The structural element displaying means displays identification information regarding the system of products or parts, and the system element relationship displaying means displays a relationship diagram of the system of products or parts indicated by identification information designated by an operator.

The structural element displaying means hierarchically displays a relationship between a product or part and a structural element.

The system element relationship displaying means displays the relationship between the plurality of products or parts of the same system and the plurality of structural elements in a matrix format diagram.

The number of structural elements used in each product or part of the same system is displayed in the matrix format diagram.

The structural element data management system may further comprise a structural element information memory means for storing a relationship between a structural drawing corresponding to each structural element and a version number of a parts list, wherein the system element relationship displaying means displays a version number of each drawing and a list.

The structural element data management system may further comprise a system registering means for registering relationship information between an additional product or part of the same system and structural elements forming the product or part with reference to a relationship diagram displayed by the system element displaying means.

Objects and advantages of the present invention are achieved in accordance with embodiments of the present invention with a structural element data management system for administration of data regarding a product or part and a structural element forming the product or part, comprising system element relationship displaying means for displaying a diagram showing a relationship between a plurality of products or parts of the same system and a plurality of structural elements; and system registering means for registering relationship information between additional products or parts of the same system and structural element of the products or parts.

The structural element data management system may further comprise information to identify whether each structural element is a mechanical element or a circuit element, wherein any of the mechanical element or circuit element is displayed in response to designation of the mechanical element or circuit element as a display object.

Objects and advantages of the present invention are achieved in accordance with embodiments of the present invention with a computer readable memory medium encoded with processing instructions for implementing a structural element data management method for administration of data regarding a product or part and a structural element forming the product or part, the method comprising displaying a relationship between a designated product or part and a structural element forming the product or part; and displaying a diagram indicating a relationship between a plurality of products or parts of the same system and a plurality of structural elements.

Objects and advantages of the present invention are achieved in accordance with embodiments of the present invention with a computer readable memory medium encoded with processing instructions for implementing a structural element data management method of administrating data regarding a product or part and a structural element forming the product or parts, the method comprising displaying a diagram indicating a relationship between a plurality of products or parts of the same system and a plurality of structural elements; and registering relationship information between an additional product or part of the same system and a structural element forming the product or part by referring to displayed relationship diagram.

BRIEF DESCRIPTION OF THE DRAWINGS

The above and other objects and advantages of the present invention will become apparent and more readily appreciated from the following description of the preferred embodiments, taken in conjunction with the accompanying drawings, of which:

FIG. 4 is a diagram of a matrix parts list in accordance with embodiments of the present invention.

FIG. 5 is a diagram of a version number management matrix in accordance with embodiments of the present invention.

DESCRIPTION OF THE PREFERRED EMBODIMENTS

Figure 1:
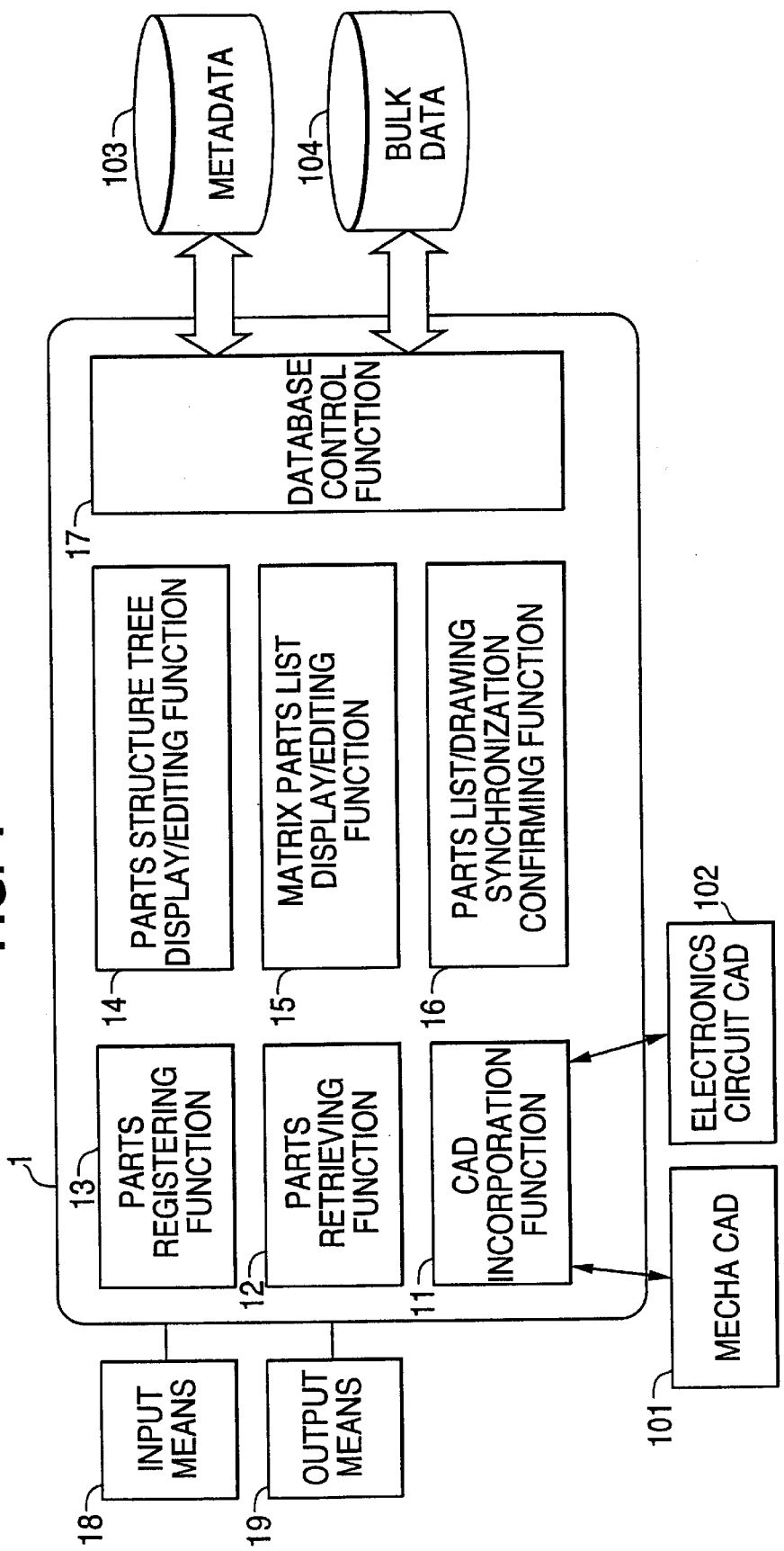
FIG. 1 is a block diagram illustrating a structural element data management system in accordance with embodiments of the present invention.

Reference will now be made to the present preferred embodiments of the invention, examples of which are illustrated in the accompanying drawings, wherein like reference numerals refer to like elements throughout.

FIG. 1 is a block diagram illustrating a structural element data management system 1 in accordance with embodiments of the present invention. The system 1 obtains various data regarding each part and structural elements of a product through cooperation with a mecha-CAD 101 for designing the mechanical parts used in the design department and an electronic circuit CAD 102 for designing circuit parts, via a CAD incorporation function 11. The system also obtains data regarding parts and structural elements through cooperation with bulk data 104, such as drawings output from the CAD systems 101 and 102, and metadata 103 comprising parts structuring information of each product output from the concept design department and detail design department.

A parts retrieving function 12 retrieves and analyzes the metadata 103 and bulk data 104 via a database control function 17 and then transfers information obtained by retrieving and metadata 103 and bulk data 104 to a parts structure tree display/editing function 14 and a matrix parts list display/edition function 15.

The parts structure tree display/editing function 14 edits and outputs to a tree structure lower level parts forming each product and assembling elements by referring to the information obtained by retrieving and analyzing the metadata 103 and bulk data 104 by the parts retrieving function 12.

The matrix parts list display/editing function 15, outputs a relationship with the structural element corresponding to the product or assembling element to be displayed in the form of the edited matrix by referring to the information obtained by the parts retrieving function 12 by retrieving and analyzing the metadata 103 and bulk data 104. The parts structure tree display/editing function 14 and matrix parts list display/editing function 15 cooperate with each other for synchronization of display contents.

The parts list/drawing synchronization confirming function 16 refers to the information concerning the parts structure administered by the metadata 103 to confirm whether or not the structural drawing of each product and each part correctly corresponds to the parts list. If the version number of the structural drawing is mismatched, the parts list/drawing synchronization confirming function 16 outputs the mismatching information.

The parts registering function 13 receives input information required for adding new products and notifies the parts structure tree display/editing function 14 and matrix parts list display/editing function 15 of the newly input information.

The structural element data management system 1 is provided with an input means 18 to input various instructions and an output means 19 to output information.

In accordance with embodiments of the present invention, the structural element data management system 1 described above overcomes problems occurring because the structural element information and parts table information must be displayed simultaneously while maintaining the incorporation thereof, and because the structural element information of new products must be added, and because matching between the structural drawing and parts list of the product and assembled elements must occur.

Embodiments of the present invention will now be explained in detail below with reference to the structural element data management system 1 applied to a personal computer.

Figure 2:
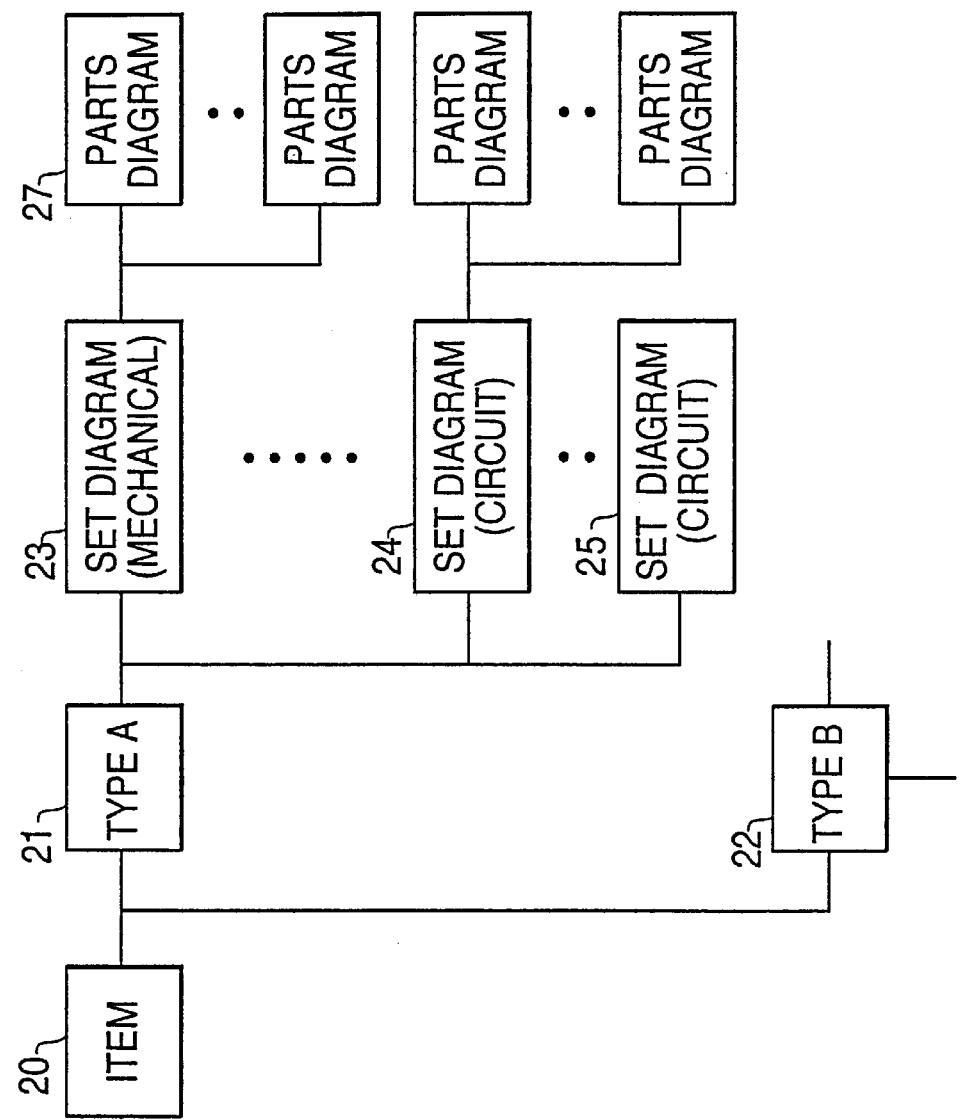
FIG. 2 is a tree diagram illustrating a mixed view of parts structure information output in accordance with embodiments of the present invention.

FIG. 2 is a tree diagram illustrating a mixed view of parts structure information output by the parts structure tree display/editing function 14 in accordance with embodiments of the present invention. As shown in FIG. 2, item 20 represents, for example, information of general classification, such as a desktop type personal computer or a laptop type personal computer. Type A 21 and type B 22 are defined in a lower hierarchical level of the item 20 and indicate, for example, information such as the product name of each product.

Set diagrams 23, 24, 25 are respectively defined in a lower hierarchical level of the type A 21 and are, for example, assembling elements indicating information of rough unit to form a product, such as a cabinet, keyboard and display, or the like. Moreover, information about the parts forming such products and a parts diagram 27 are also displayed in the tree structure in the lower hierarchical level of the respective assembling elements 23, 24, 25.

As shown in FIG. 2, set diagram 23 indicates a mechanical part as the part forming the product, and set diagrams 24 and 25 indicate circuit parts. However, the parts structure tree display/editing function 14 is also capable of displaying only the circuit parts, or alternatively only the mechanical parts.

FIG. 4 is a diagram of the matrix parts list output by the matrix parts list display/editing function 15 in accordance with embodiments of the present invention. The matrix parts list receives a designation of the product or assembling elements to be displayed, displays the products or the assembling elements of the same system on the horizontal axis, while the structural elements forming such products are displayed on the vertical axis. The matrix parts list also displays the number of structural elements used in the product or assembling elements displayed on the horizontal axis at the intersecting point with the corresponding structural elements.

For example, the product "LX-277B" is assembled by using the structural elements "K270074*1" and "L370768*1" one by one. Therefore, the number of parts to be used is displayed as a numeral (e.g., "1") at the respective intersecting points, and a numeral is not displayed at the intersecting point of the product or assembling element and a structural element which is not used.

FIG. 5 illustrates a version number management matrix output from the parts list/drawing synchronization confirming function 16 in accordance with embodiments of the present invention. As shown in FIG. 5, the vertical axis and horizontal axis are similar to that of the matrix parts list illustrated in FIG. 4. However, the version number management matrix content displays version information of structural drawings and a parts list of respective assembling elements. The structural drawing illustrates, in the form of a drawing, which assembling elements are required, and the parts list displays the detailed information of respective structural elements. The product and assembling elements may be expressed by the structural drawing and parts list.

For example, as shown in FIG. 5, the assembling element "N840158*1," which is a structural element of the product "LX-277C," has the version No. V2R1 of the structural drawing and uses the version No. V2R1 of the parts list. Moreover, it can also be understood from FIG. 5 that the assembling element "K270074*1" has a version number of the parts list which is newer (more recent) than the version number of the structural drawing, and therefore only the parts list is newly updated by a department different from the concept design department and detail design department.

When mismatching between the version number of the structural drawing and parts list is generated, the parts list/drawing synchronization confirming function 16 notifies, through the CAD incorporation function 11, the parts list update information to mecha-CAD 101, electronic circuit CAD 102 and the other departments in charge of design (not shown in the drawings) and also notifies that the structural drawing must also be updated. Therefore, the condition in which mismatching between the structural drawing and parts list is generated and maintained can be prevented.

Figure 6:
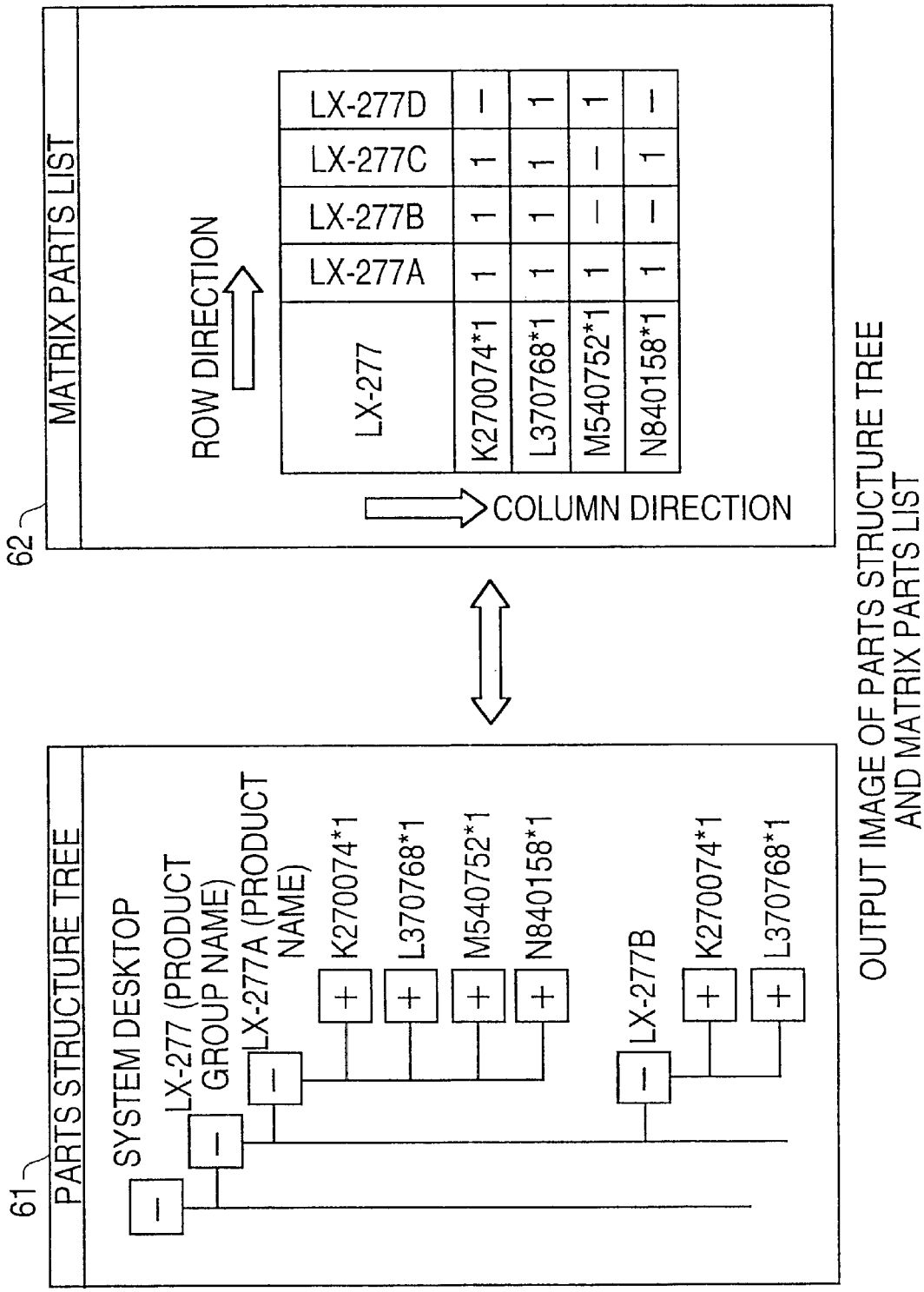
FIG. 6 illustrates an output image display of a parts structure tree and a matrix parts list in accordance with embodiments of the present invention.

FIG. 6 illustrates a display image which simultaneously incorporates and outputs the parts structure tree 61 (illustrated in FIG. 2) and the matrix parts list 62 (illustrated in FIG. 4) in accordance with embodiments of the present invention. As shown in FIG. 6, when the parts structure tree 61 receives designation of the product or assembling element in the matrix parts list 62, information which is one step lower in level is output to the horizontal axis and information which is two steps lower in level to the vertical axis corresponding to such designation.

For example, as shown in FIG. 6, in the parts structure tree 61, since "LX-277" indicating the product group name is designated, the product name "LX-277A", "LX-277B", etc. which is one step lower in level is displayed on the horizontal axis in the matrix parts list 62, and the assembling element name "K270074*1", "L370768*1", etc. which is two steps lower in level is displayed on the vertical axis of the matrix parts list. Moreover, when the matrix parts list 62 is instructed to display the version number management matrix, the matrix parts list 62 updates the content of matrix parts list 62 to the version number management matrix and then it is output.

Figure 7:
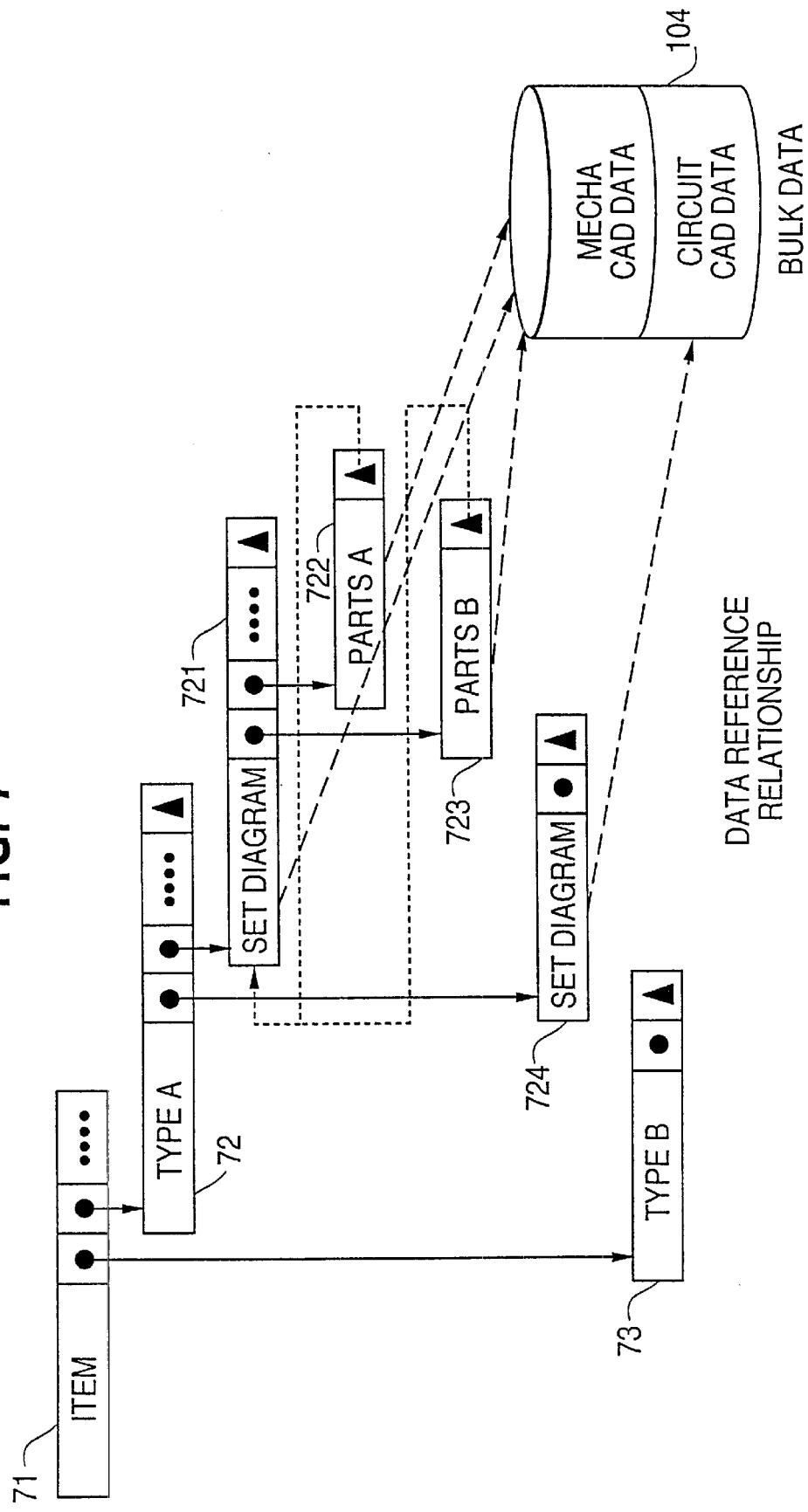
FIG. 7 illustrates a reference relationship of data in accordance with embodiments of the present invention.

FIG. 7 illustrates a data reference relationship in accordance with embodiments of the present invention. The data reference relationship is the internal data to which the parts structure tree display/editing function 14 refers on the occasion of displaying the parts structure tree illustrated in FIG. 2. Moreover, the item 20, type A 21, type B 22, set diagram (mechanical) 23, set diagram (circuit) 24 shown in FIG. 2 respectively correspond to item 71, type A 72, type B 73, set diagram A 721, set diagram B 724 shown in FIG. 7. Furthermore, each parts diagram represented by the parts diagram 27 corresponds to the location data such as the parts A 722 and parts B 723. Data, such as set diagram and parts, is registered in the bulk data 104 as the drawing data.

Each item of data illustrated in FIG. 7 contains information defining a so-called parent and child relationship in which the higher hierarchical level of the tree structure is defined as parent and the lower hierarchical level as child and the information regarding structural element. For example, the data of the item 71 includes information indicating the data of type A 72 and type B 73, which is one step lower level data, namely child data. Therefore, the parts structure tree display/editing function 14 can detect the parent and child relationship of each product, assembling element and parts by referring to this information and can display the parts structure tree 61 as illustrated in FIG. 2.

Figure 3:
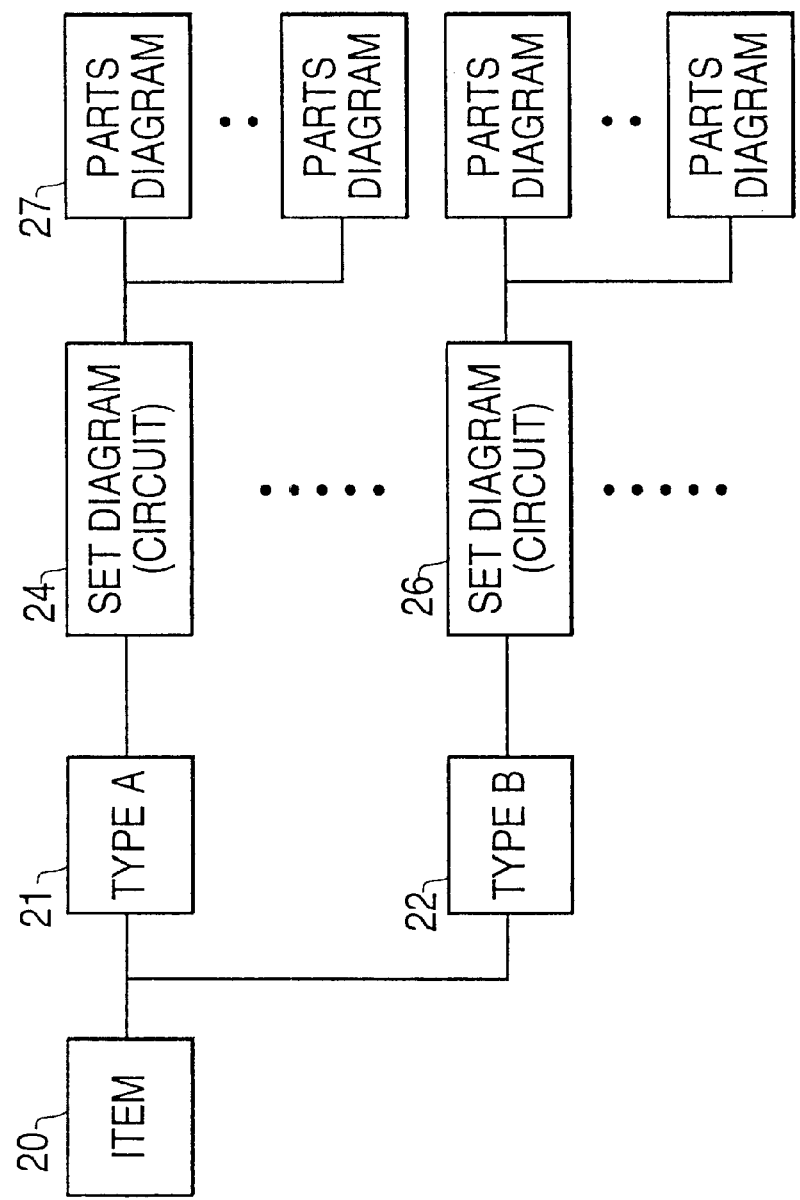
FIG. 3 is a tree diagram illustrating a circuit view of the parts structure information in accordance with embodiments of the present invention.

Moreover, when the parts structure tree display/editing function 14 displays a tree having only circuit parts, as shown in FIG. 3, or a tree having only mechanical elements (not shown in the drawings), the set diagram A 721, parts A 722 and parts B 723, for example, contain information indicating that these belong to the mechanical CAD data in the bulk data 104. In this case, since the set diagram B 724 also contains information indicating that it belongs to the circuit CAD data in the same manner, when an instruction is received to display the circuit view displaying the tree having only the circuit parts illustrated in FIG. 3, the mechanical view displaying the tree having only the mechanical element, and the mixed view simultaneously displaying both parts illustrated in FIG. 2, the views may be switched by utilizing the circuit/mechanical identifying information contained in each set diagram and parts data.

Figure 9:
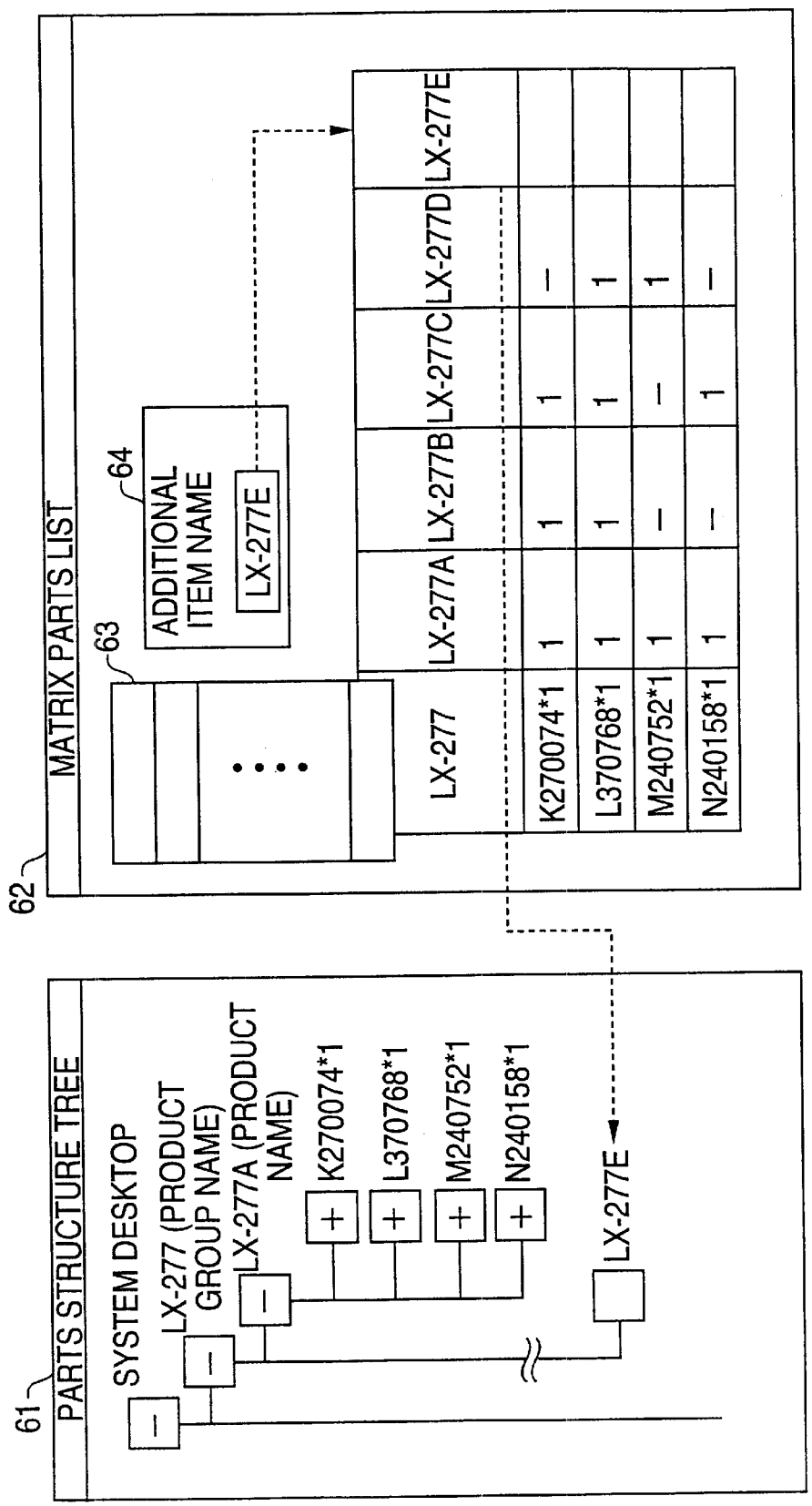
FIG. 9 is a diagram of an output image display of a variation type addition in accordance with embodiments of the present invention.

FIG. 9 illustrates a profile of added variation types in accordance with embodiments of the present invention. A variation type is a type which may be produced by changing only a certain part of the same product, for example, in cases in which only the color of the cabinet is different or only the power supply unit is different because the country in which the power supply unit is sold is different. More particularly, the variation type is a type which may be produced only by assembling a certain part of the structural element forming the original product to the other structural element. In such a variation type, when a new variation type is added, it may be realized when the producing and design department alters the parts list even if the concept design department and detail design department do not change the structural drawing.

As shown in FIG. 9, upon receiving an instruction for an addition from a matrix parts list update instruction 63 and the information to add to the horizontal axis of the matrix from an addition content 64, the parts registering function 13 notifies such information to the matrix parts list display/editing function 15 and parts structure tree display/editing function 14. The respective display/editing functions 14, 15 provide the new horizontal axis within the matrix parts list 62 and the new display item in the parts structure tree 61.

For example, as shown in FIG. 9, when the parts registering function 13 receives the instruction to add the variation type "LX-277E", the matrix parts list display/editing function 15 provides a column of "LX-277E" on the horizontal axis of the matrix parts list 62 and the parts structure tree display/editing function 14 determines, from the received information, that addition is made to the level corresponding to the product name and newly displays "LX-277E" at the level of the product name in the parts structure tree 61.

Moreover, since the number of structural elements to be used is input in the matrix parts list 62, such information is notified to the parts structure tree display/editing function 14 from the matrix parts list display/editing function 15 and the corresponding structural elements are also displayed in the parts structure tree 61.

For example, when "1" is input to the intersecting point of the product "LX-277E" and structural element "K270074*1" in the matrix parts list 62, the matrix parts list display/editing function 15 notifies the parts structure tree display/editing function 14 that the product "LX-277E" uses only one structural element "K270074*1," and "K270074*1" is displayed in the one stage lower level of "LX-277E" in the parts structure tree 61.

Moreover, when a structural element is designated in the parts structure tree 61 and it is then copied to a new structural element, the copied structural element is also displayed on the parts structure tree 61, and such information is then notified to the matrix parts list display/editing function 15 from the parts structure tree display/editing function 14. Thereby, the number of corresponding structural elements is displayed in the matrix parts list 62.

Figure 8:
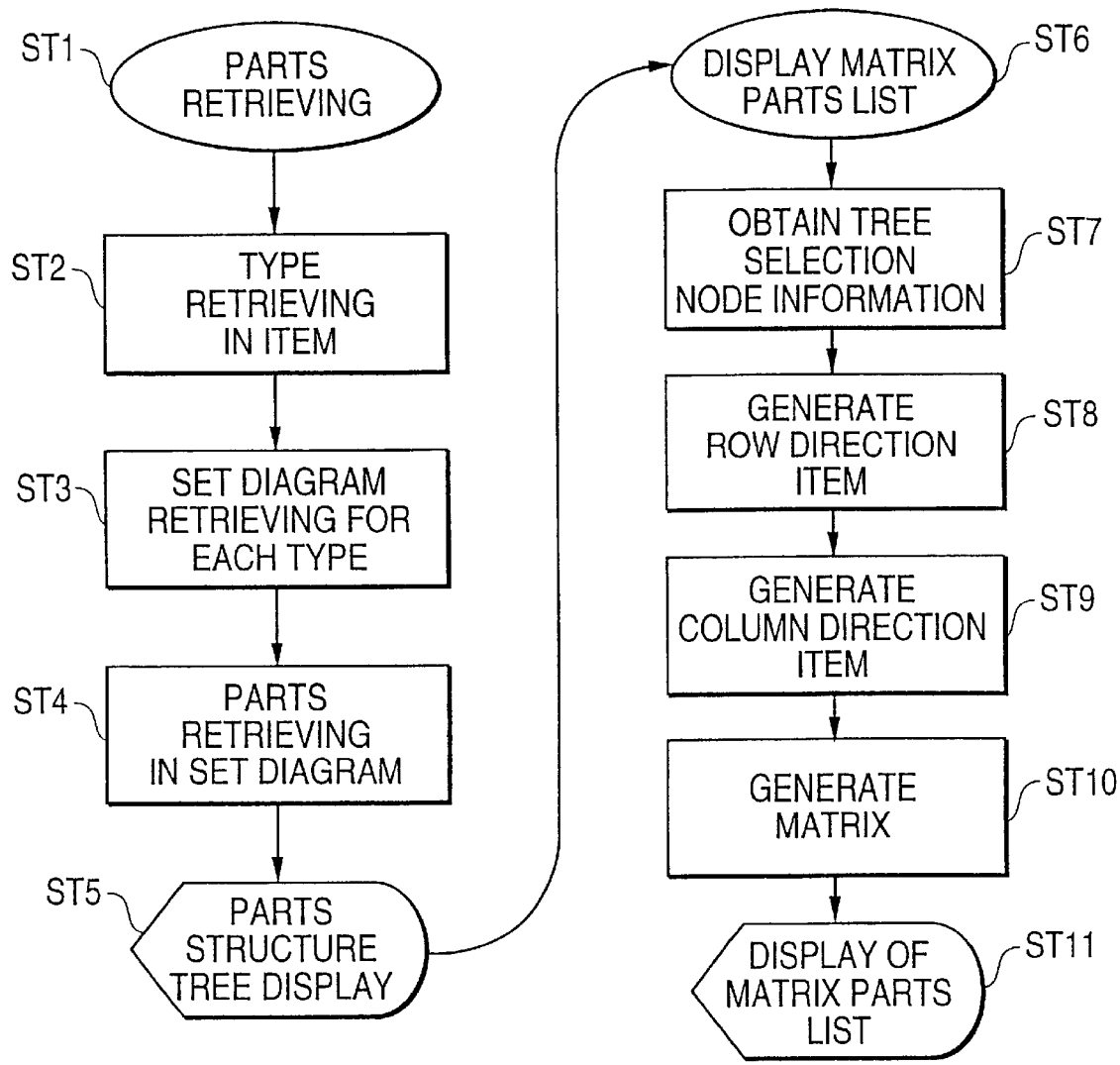
FIG. 8 is a flow chart of an operational process for generating a parts structure tree and a matrix parts list in accordance with embodiments of the present invention.

Referring now to FIG. 8, an operational process for generating the parts structure tree 61 and matrix parts list 62 in accordance with embodiments of the present invention will now be described below. The operational process is performed using the system 1 shown in FIG. 1.

First, when an instruction to display the parts is received from the input means 18, the parts retrieving function 12 starts a parts retrieving process to retrieve the metadata 103 and bulk data 104 through the database control function 17, and then transfers the retrieved data to the parts structure tree display/editing function 14 (step ST1).

The parts structure tree display/editing function 14 then performs a type retrieving in the item (step ST2) to obtain, based on the information received, information regarding the items to be displayed and parent-child relationship by referring to the data illustrated in FIG. 7, a set diagram retrieving process for each type (step ST3), and a parts retrieving process in the set diagram (step ST4). The parts structure tree display/editing function 14 edits the information to the parts structure tree 61 illustrated in FIG. 2 and then outputs the information using the output means 19.

A circuit view or mechanical view parts structure tree display instruction is then received from the input means 18 (step ST5). The parts structure tree display/editing function 14 determines whether it is a circuit element or a mechanical element by referring to the information of each assembling element illustrated in FIG. 7, based on the information of the metadata 103 and bulk data 104 received from the parts retrieving function 12. An output from the output means 18 is again provided by switching the display to the tree display of only the data corresponding to the designated view illustrated in FIG. 3.

Following the display of the parts structure tree, when a matrix parts list display instruction is received from the input means 18, the matrix parts list display/editing function 15 is notified of the matrix parts list display instruction (step ST6). The matrix parts list display/editing function 15 obtains, from the parts structure tree display/editing function 14, information indicating which product or assembling element is receiving the display instruction to obtain tree selection node information (step ST7). Next, the information which the parts retrieving function 12 has previously retrieved, the metadata 103 and bulk data 104 through the database control function 17 can be received.

Continuing, in step ST8, a row direction item is generated by referring to the data illustrated in the data reference relationship of FIG. 7, to collect the items to be displayed on the horizontal axis. For example, when the product group name "LX-277" is designated as illustrated in the parts structure tree 61 shown in FIG. 6, the matrix parts list display/editing function 15 receives the information from the parts structure tree display/editing function 14 and refers to the item data 71 of the hierarchical level corresponding to the product group name, for example, from the data illustrated in FIG. 7 among the data received from the parts retrieving function 12.

In the child data of such data, namely, in the parts structure tree 61, data corresponding to the product name in the one step lower hierarchical level of the data designated first by the parts structure tree 61 to be displayed on the horizontal axis of the matrix is collected by referring to the pointer indicating the type A 72 and type B 73 respectively corresponding to the product name "LX-277A" and "LX-277B".

In the same manner, in step ST9, a column direction item is generated by referring to the data received from the parts retrieving function 12, and the data collected in step ST8 to collect the data having a one step further lower hierarchical level of the data of one step lower level of the data designated first by the parts structure tree 61.

For example, the data corresponding to the assembling element having a hierarchical level which is two steps lower than the hierarchical level designated first by the parts structure tree 61 to be displayed on the vertical axis of the matrix parts list 62 are collected by referring to the data of product name collected in the preceding step ST8. Specifically, by referring to the type A 72 and type B 73 corresponding to "LX-277A" and "LX-277B", respectively, of the parts structure tree 61 and then sequentially referring to the pointers of the assembling elements such as set diagram A 721 and set diagram B 724 corresponding to "K270074*1" and "L370768*1" respectively, as the assembling element forming the lower hierarchical level of the product name in the child data of the above data, namely in the parts structure tree 61. Moreover, data collected to be displayed on the vertical axis of the matrix parts list 62 is edited, considering the duplication, etc.

A matrix is then generated (step ST10) and the information regarding how many assembling elements or parts are used by the items to be displayed in the matrix, specifically, the product or assembling element indicated on the horizontal axis, can be obtained.

For example, the information that a product of type A 72, namely "LX-277A," displayed on the horizontal axis is structured by the set diagram A 721 and set diagram B 724, namely, the assembling elements "K270074*1" and "L370768*1" can be obtained in step ST8 and step ST9. Therefore, the information about the number of set diagrams to be displayed in the matrix can be obtained in step ST10 by further referring to how many set diagrams A 721 and B 724 as the data on the vertical axis are included in the type A 72 as the data on the horizontal axis.

Finally, in step ST11, the matrix parts list is displayed by editing the information obtained in step ST8 and step ST10 to the matrix information. The matrix parts list 62 as illustrated in FIG. 4 is output using the output means 19.

When an instruction to display the version number management matrix indicating the version numbers of the drawing and parts list is received from the input means 18 during the matrix parts list display step (step ST6), the instruction to display the version number management matrix is notified to the matrix parts list display/editing function 15 and the parts list/drawing synchronization confirming function 16.

The steps of obtaining tree selection node information (step ST7), generating a row direction item (step ST8) and generating a column direction item (step ST9) are also executed as described above by the matrix parts list display/editing function 15. However, in the matrix generating process (step ST10), the parts list/drawing synchronization confirming function 16 obtains information regarding which version number of the structural drawing and parts list is used for the assembling elements or parts indicated on the horizontal axis, by referring to the information of the structural drawing and parts list of the metadata 103 through the database control function 17.

For example, the information that the product of type A 72, namely "LX-277A," displayed on the horizontal axis is structured by the set diagram A 721 and set diagram B 724, namely, the assembling elements "K270074*1" and "L370768*1," respectively, is obtained in step ST8 and step ST9. Therefore, the information about the version number of the drawing and parts list is obtained in step ST10 for displaying the version number management matrix by retrieving the assembling elements and parts as the data on the vertical axis, specifically, the set diagram A 721 and the set diagram B 724 from the metadata 103 through the database control function 17.

In the matrix parts list display process of step ST11, the data is edited to the version number management matrix, as shown in FIG. 5, on the basis of the information obtained in steps ST8 and ST10 and the matrix parts list 62 is then updated to the version number management matrix and is then output using the output means 19.

Figure 10:
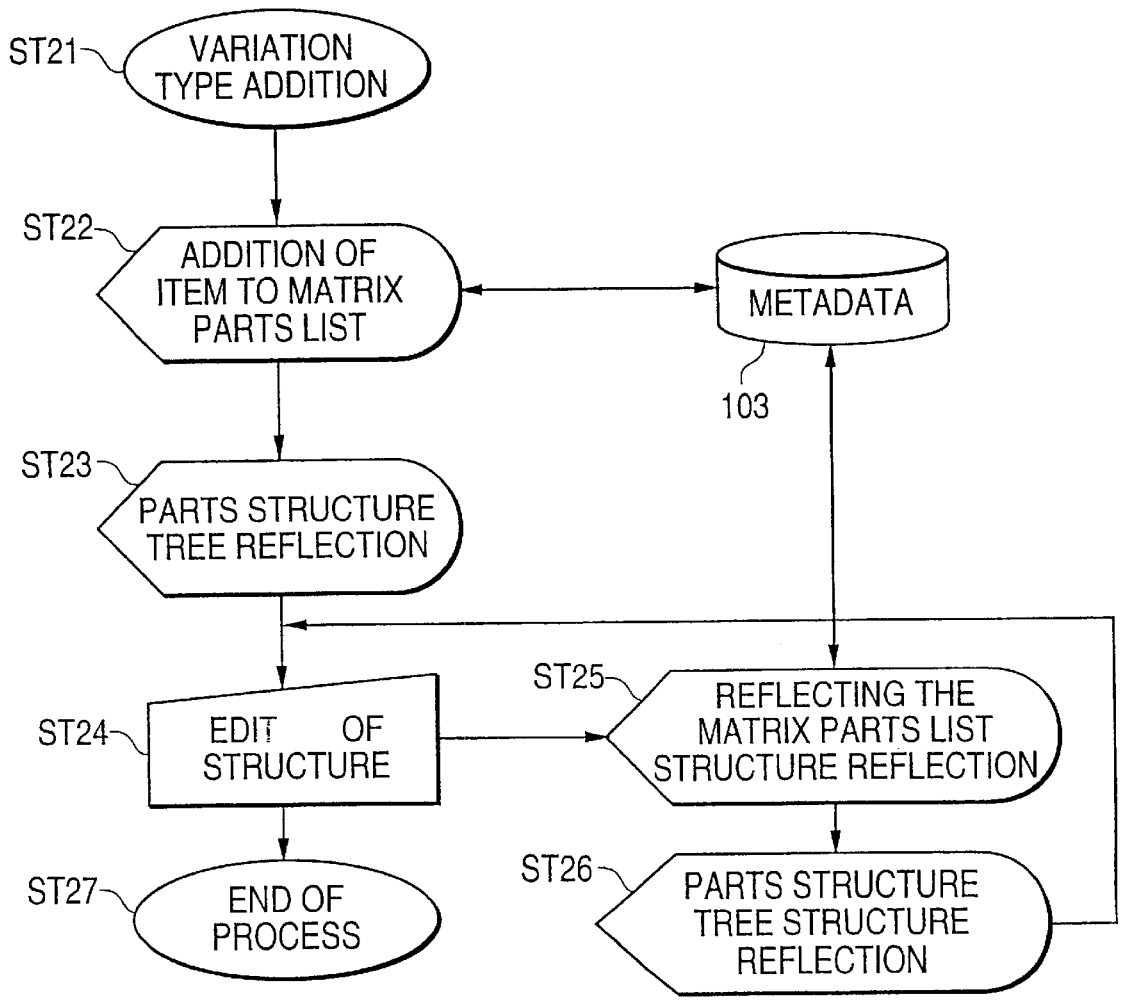
FIG. 10 is a flow chart of an operational process for generating a variation type addition in accordance with embodiments of the present invention.

Referring to FIG. 10, an operational process performed by the structural element data management system 1 illustrated in FIG. 1 to add a variation type, as shown illustrated in FIG. 9, will now be described below.

In the case where the update instruction of the matrix parts list 62 is input from the input means 18 when an output as illustrated in FIG. 9 appears in the parts structure tree 61 and matrix parts list generating operational process shown in FIG. 8, the parts registering function 13 outputs the matrix parts list update instruction 63.

When an addition instruction is input from the matrix parts list update instruction 63, the parts registering function 13 displays the content of the addition 64 with a variation type adding process (step ST21) to accept the information for addition. Upon receipt of the information to be added, the addition information is notified to the matrix parts list display/editing function 15, the item is added to the matrix parts list (step ST22) and the added information is additionally displayed on the horizontal axis of the matrix parts list 62. Moreover, the additional information is notified to the matrix parts list display/editing function 15 and the additional information is simultaneously written to the metadata 103 via the database control function 17.

For example, upon receipt of "LX-277E" as the additional item name in the content of the addition 64, the parts registering function 13 notifies of the matrix parts list display/editing function 15 of "LX-277E" as the additional display information on the horizontal axis. The parts registering function also obtains information from the matrix parts list display/editing function 15 regarding that data of which the hierarchical level is displayed on the horizontal axis of the matrix currently being displayed, specifically, data of the hierarchical level of product name is displayed in the matrix parts list 62. The parts registering function 13 thereby recognizes that the data "LX-277E" newly received as the additional item is the data of the hierarchical level of the product name, and writes the data of item name of "LX-277E" in the hierarchical level of the product name to the metadata 103.

Next, a parts structure tree reflecting operation (step ST23) is performed to notify the parts structure tree display/editing function 14 of the additional information, and the parts structure tree display/editing function 14 displays such additional information to the parts structure tree.

For example, since the parts registering function 13 has received, in step ST22, the data "LX-277E" having the hierarchical level of the product name as the additional information, it notifies the parts structure tree display/editing function 14 to additionally display the item "LX-277E" at the hierarchical level of product name. The parts structure tree display/editing function 14 additionally displays "LX-277E" at the hierarchical level of the product name, namely, in the same hierarchical level as "LX-277E".

Subsequently, when the number of structural elements to be used is input to the matrix parts list 62 for a new product or assembling element added by the structure editing operation (step ST24), the parts registering function 13 notifies the information about the number of parts to be used to the matrix parts list display/editing function 15 by the matrix parts list structure reflecting operation (step ST25) and also displays the number information to the relevant column in the matrix parts list 62.

Moreover, the parts registering function 13 notifies the matrix parts list display/editing function 15 of the information about the number of parts to be used, and simultaneously writes the information about the number of parts to be used by the added product or assembling element to the metadata 103 via the database control function 17.

For example, when the number "1" is input to the column at the intersecting point of "LX-277E" and "K270074*1" of the matrix parts list 62, the parts registering function 13 recognizes, in step ST25, that the hierarchical level data of product name "LX-277E" includes one "K270074*1" data, which is data one step lower in level than the product name data. The parts registering function 13 notifies the matrix parts list display/editing function 15 of the information about the number of parts to be used to output the input information to the matrix, and also writes, to the metadata 103, that the input data "LX-277E" having the hierarchical level of product name has one structural element data "K270074*1" at the one step lower hierarchical level.

Moreover, in this case, the structural element "K270074*1" included in "LX-277E" is already used, for example, in "LX-277A", as the internal data and it exists within the metadata 103 as an assembling element already used by the other product. Therefore, the data "K270074*1" added to the metadata 103 directly succeeds the attribute, such as the version number of the structural drawing and the version number regarding the data "K270074*1", already registered.

Next, a parts structure tree reflection operation is performed wherein the parts registering function 13 notifies the information about the number of parts to be used to the parts structure tree display/editing function 14 (step ST26). The parts structure tree display/editing function 14 additionally displays the assembling elements or parts used depending on the notified number information at the hierarchically lower level of the product or assembling element previously additionally displayed.

For example, the parts registering function 13 recognizes in step ST25 that the data "LX-277E" having the hierarchical level of the product name includes one data "K270074*1" which is one step lower level, and therefore notifies such information to the parts structure tree display/editing function 14. Here, the parts structure tree display/editing function 14 additionally displays "K270074*1" as the data which is one step lower level of the additionally displayed data "LX-277E".

Number input in steps ST24 through ST26, display reflection on the matrix parts list and parts structure tree and information reflection on the metadata 103 are repeated for the number of times required.

Information added and updated to the metadata 103 through the database control function 17 is notified, as required, to the related order issuing department and production line.

The operational processes of the system 1 described above in accordance with embodiments of the present invention are preferably realized by a program, and the program may be distributed in the form of a memory medium, such as CD-ROM or the like, or is preferably distributed from a processor including the function of transmitting the relevant program via a network.

Embodiments of the present invention have been described in detail above with reference to the figures. However, the present invention is not limited thereto. For example, embodiments of the present invention have been described hereinabove as applied to a structural element management system of a personal computer, but the present invention is not limited in application to a personal computer.

As described hereinabove, in accordance with embodiments of the present invention, the structural element information of a product and system element information of a parts list or the like can be simultaneously displayed. Moreover, the system element information has a structure to display in parallel detailed structural element information of the product or assembling element of the same system. Therefore, in accordance with embodiments of the present invention, it is possible to easily refer to the structural element information of the existing similar product. Thereby, a department, different from the concept design department and detail design department, may easily add the new product and update the structural element. Furthermore, since such structure is provided, only a small number of procedures are required for detail changes in comparison with the existing procedures, and thereby quick measures can be taken.

Still further, since the version number of the structural drawing and parts list required for assembling the product and parts may be administrated in correspondence and mis-matching can easily be detected, a job which has been realized only by the concept design department and detail design department can also be performed even by the producing and design department. Moreover, if the structural element information is updated in a different department, the information for update of drawings may be quickly notified to the necessary departments and total matching can easily be maintained.

Furthermore, since the circuit elements and mechanical elements having different properties in the step of design can be processed as similar parts, the number of elements or parts can be easily detected.

Although a few preferred embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A structural element data management system for management of data regarding a product or a part and a structural element forming the product or part, comprising:
   structural element displaying means for displaying a relationship between a product or part and a structural element forming the product or part;
   system element relationship displaying means for displaying a matrix format diagram indicating a relationship between a plurality of products or parts of a same system and a plurality of structural elements, with a number of the structural elements used in the product or part at intersecting points of the diagram; and
   system registering means for providing a column of an additional product or part of the same system on the displayed diagram, receiving the number of the structural elements input at intersecting points, and registering relationship information between the additional product or part and the structural elements.

2. The structural element data management system as recited in claim 1, wherein the system element relationship displaying means displays a relationship diagram of a system which is the same as a product or part designated by an operator for display by the structural element displaying means.

3. The structural element data management system as recited in claim 1, wherein the structural element displaying means displays identification information regarding the system of products or parts, and
   the system element relationship displaying means displays a relationship diagram of the system of products or parts indicated by identification information designated by an operator.

4. The structural element data management system as recited in claim 1, wherein the structural element displaying means hierarchically displays a relationship between a product or part and a structural element.

5. The structural element data management system as recited in claim 1, wherein the system element relationship displaying means displays the relationship between the plurality of products or parts of the same system and the plurality of structural elements in the matrix format diagram.

6. The structural element data management system as recited in claim 5, further comprising:
   a structural element information memory means for storing a relationship between a version number of a structural drawing corresponding to each structural element and a version number of a parts list,
   wherein the system element relationship displaying means displays a version number of each structural drawing and a corresponding parts list and if there is a mismatch between the version number of the structural drawing and the version number of the parts list, provides a notification to update the drawing or the parts list.

7. A structural element data management system for administration of data regarding a product or part and a structural element forming the product or part, comprising:
   system element relationship displaying means for displaying a matrix format diagram indicating a relationship between a plurality of products or parts of a same system and a plurality of structural elements, with a number of the structural elements used in the product or part at intersecting points of the diagram; and
   system registering means for providing a column of an additional product or part of the same system on the displayed diagram, receiving the number of the structural elements input at intersecting points, and registering relationship information between additional product or part and the structural elements.

8. The structural element data management system as recited in claim 1, further comprising:
   information to identify whether each of the structural elements is a mechanical element or a circuit element,
   wherein any of the mechanical element or the circuit element is displayed in response to designation of the mechanical element or the circuit element as a display object.

9. A computer readable memory medium encoded with processing instructions for implementing a structural element data management method to administrate data regarding a product or part and a structural element forming the product or part, the method comprising:
   displaying a relationship between a designated product or part and a structural element forming the product or the part;
   displaying a matrix format diagram indicating a relationship between a plurality of products or parts of a same system and a plurality of structural elements, with a number of the structural elements used in the product or part at intersecting points of the diagram; and providing a column of an additional product or part of the same system on the displayed diagram;

receiving the number of the structural elements input at intersecting points of the diagram; and registering relationship information between the additional product or part and the structural elements.

10. A computer readable memory medium encoded with processing instructions for implementing a structural element data management method of administrating data regarding a product or part and a structural element forming the product or parts, the method comprising:

displaying a matrix format diagram indicating a relationship between a plurality of products or parts of a same system and a plurality of structural elements, with a number of the structural elements used in the product or part at intersecting points of the diagram;

providing a column of an additional product or part of the same system on the displayed diagram;

receiving the number of the structural elements input at intersecting points of the diagram; and registering relationship information between the additional product or part and the structural elements.

11. An apparatus, comprising:

a data storage device; and a processor connected to the data storage device, the data storage device storing a program to control the processor and the processor operative with the program to display a relationship between a designated product or part and a structural element forming the designated product or part, to display a matrix format diagram indicating a relationship between a plurality of products or parts of a same system and a plurality of structural elements, with a number of the structural elements used in the product or part at intersecting points of the diagram, to provide a column of an additional product or part of the same system on the displayed diagram, to receive the number of the structural elements input at intersecting points of the diagram, and to register relationship information between the additional product or part and the structural elements.

12. An apparatus, comprising:

a data storage device; and a processor connected to the data storage device, the data storage device storing a program to control the processor and the processor operative with the program to display a matrix format diagram indicating a relationship between a plurality of products or parts of a same system and a plurality of structural elements, with a number of the structural elements used in the product or part at intersecting points of the diagram, to provide a column of an additional product or part of the same system on the displayed diagram, and to receive the number of the structural elements input at intersecting points of the diagram, and to register relationship information between the additional product or part and the structural elements.

* * * * *